United States Patent Office 3,345,171
Patented Oct. 3, 1967

3,345,171
PHOTOCHEMICAL INSOLUBILIZATION OF POLYMERS

Urbain Leopold Laridon, Wilrijk-Antwerp, and Gerard Albert Delzenne, Kessel-Lo, Belgium, assignors to Gevaert Photo-Producten N.V., Mortsel-Antwerp, Belgium, a company of Belgium
No Drawing. Filed Dec. 2, 1963, Ser. No. 327,484
15 Claims. (Cl. 96—36)

The present invention relates to a process for photochemically decreasing the solubility of polymers, to the production of printing plates and resist images, and to the printing plates and resist images obtained by this process.

The light-sensitivity of monomeric arylazido group-containing compounds has been described in the literature and their use in the reproduction field has frequently been suggested. Thus, it is well known that physical mixtures of monomeric arylazido group-containing compounds with certain polymeric materials such as casein, gelatin, albumin and synthetic resins when coated onto a suitable support and exposed to light under a process transparency, give tanned images which are insoluble and can function as printing plate surfaces. The fact, however, that the light-sensitive compound and the polymer are separate entities makes it necessary to take special precautions in the preparation and processing to ensure uniform distribution and proper functioning of the components, so that durable, high quality and reproducible printing surfaces are obtained.

Light-sensitive azido group-containing polymers have also been described, in which the azido groups are substituted on the aromatic nuclei of previously prepared aromatic polymeric compounds. For this purpose the aromatic polymeric compounds are successively nitrated, reduced, then diazotized and finally the diazo groups are converted into azido groups (Swiss patent specification 363,353).

This process, however, is very cumbrous due to the great number of successive steps. Furthermore, there has to be taken into account that reactions with polymers are much more difficult to carry out than the same reactions with monomeric compounds. The yield of reactions with polymers is almost never quantitative and when the desired reaction give rise to side reactions, undesired groups are introduced into the polymer chain. Another reason why difficulties arise is that the classical purification methods such as recrystallization and distillation cannot be applied to polymers.

The most logical method would consist in starting from monomeric compounds carrying aromatic azido groups and then converting these monomers into high molecular weight compounds by polymerization or polycondensation. However, the azido group is very reactive with the usual catalysts for vinyl polymerizations. Hence it is practically impossible to polymerize aromatic azido group-containing monomers. Moreover, the synthesis of vinyl type monomers bearing azido groups is extremely difficult.

Further, polycondensations by the classical polycondensation techniques of monomeric compounds bearing aromatic azido groups do not lead to high polymers on account of the high temperature required in these processes by which the azido groups are destroyed.

We have discovered certain new arylazido group-containing polycondensates of high molecular weight and which are light-sensitive, and also a method for their manufacture from monomeric intermediates bearing arylazido groups. Therefore, one object of the invention is to provide a method for preparing soluble, high molecular weight, light-sensitive arylazido group-containing polycondensates. Another object is to provide light-sensitive materials for use in making photographic resists and photographic printing plates. Another object is to provide methods of making photographic relief images from high molecular weight, light-sensitive polycondensates. A still further object is to provide light-sensitive self-supporting flexible films of arylazido group-containing polycondensates. Other objects will appear from the following description and claims.

We have discovered that these objects are accomplished by soluble high molecular weight, light-sensitive arylazido group-containing polycondensates of classes which are unknown up to now and which are characterized thereby that they are obtained by interfacial polycondensation reaction of at least two monomeric intermediates, at least one of these monomeric intermediate comprising an arylazido substituent.

What is generally known as the interfacial polycondensation method may be carried out with a large number of variations, not all of which are equally adaptable to the preparation of each specific arylazido group-containing polycondensate. The broad methods falling within the scope of this process include the following:

(1) Systems in which one of the intermediates is dissolved or dispersed in water, or water and another diluent and in which the second intermediate is undiluted if it is a liquid or is dissolved or dispersed in a non-aqueous liquid diluent of such character that on mixing the liquids a system of two liquid phases is obtained initially;

(2) Systems in which one of the intermediates is dissolved or dispersed in water and the second intermediate is dissolved or dispersed in an organic solvent which is immiscible with water, but which is at the same time a solvent for the polycondensate to be formed.

These interfacial polycondensation techniques are among others described in S.P.E. Journal, 15, 485 (1959) and Plastica, 13, 520, 668 (1960).

Very high molecular weights have been obtained according to the second of the above-mentioned methods, thus by interfacial polycondensation processes wherein one of the diluents present is a solvent for the polycondensate to be formed. Such a method and the products obtained thereby have been described among others in United States specification 3,028,364 and in pending applications Ser. No. 731,874 filed Apr. 30, 1958, now Patent No. 3,216,970, Ser. No. 62,076, filed Oct. 12, 1960, now abandoned, and Ser. No. 103,227, filed Apr. 17, 1961, now abandoned.

The soluble, high molecular weight, light-sensitive arylazido group-containing polycondensates may be obtained by the interfacial polycondensation of a large number of different low molecular weight organic compounds, which will further be mentioned as monomeric intermediates, provided that at least one of the monomeric intermediates carries an arylazido group. Among the possible polycondensation reactions which may be accomplished according to the above-mentioned interfacial polycondensation procedures may be mentioned:

(1) The reaction of primary or secondary amines with dicarboxylic acid halides, with disulfonic acid halides, with phosgene, with glycol-bischloroformates, with diisocyanates or with diisothiocyanates.

(2) The reaction of dicarboxylic acid halides with dihydric phenols, with dithiols, with aminothiols or with aminoalkyl phenols.

(3) The reaction of disulfonic acid halides with dihydric phenols or with dithiols.

It is obvious that as a single monomeric intermediate compound may be used containing two different reactive groups capable to condense.

It is also obvious that two or more of the above reactions can be combined, or that mixtures of monomeric intermediates may be used whereby co-polycondensates are obtained.

The inerfacial polyesterification reactions may be carried out in the presence of minor amounts of onium compounds selected from the group consisting of quaternary ammonium compounds, tertiary sulfonium compounds, quaternary phosphonium compounds and quaternary arsonium compounds. These onium compounds function as catalysts. The use of these compounds has been described among others in pending applications Ser. No. 62,076, filed Oct. 12, 1960, Ser. No. 95,002, filed Mar. 13, 1961, now Patent No. 3,227,681, and Ser. No. 95,470, filed Mar. 14, 1961, now Patent No. 3,230,195. These catalysts are preferably added to the reaction mixture in amounts of from 0.1 to 5% by weight of the monomeric intermediates. The best suited catalysts are those which are soluble in the two phases. They may be added before, during or after mixing both phases.

In all these interfacial polycondensation reactions at least one of the monomeric intermediates is substituted by an arylazido group. These monomeric intermediates carrying arylazido groups are obtained by processes generally known in organic chemistry, such as by diazotation of an amino radical fixed on an aromatic group followed by reaction with sodium azide. Since these reactions take place, however, with low molecular weight compounds they are easily carried out in high yields.

Moreover, the interfacial polycondensation of the monomeric intermediates is carried out at room temperature or at least at much lower temperatures than those required for classical polycondensations. At these lower temperatures the azido group is stable and there is no risk for decomposition of the monomeric intermediates.

The arylazido group-containing polycondensates of the present invention still have other advantages. Since a large series of different light-sensitive high molecular weight arylazido group-containing polycondensates can be obtained, it is possible to choose the monomeric intermediates containing the arylazido group in view of the special requirements of the desired application. For instance, if the light-sensitive polycondensate is intended for forming an etching resist on a metallic support such as copper, zinc, etc., the monomeric intermediates can be chosen in such a way that polycondensates are obtained having a good adhesiveness to metals. By an appropriate choice of the monomeric intermediates the solubility of the polycondensates can also be adapted.

Very important, however, is that by means of the processes described and especially by using in the interfacial polyesterification reaction a common solvent for at least one of the monomeric intermediates and the polycondensates to be formed, polycondensates of very high molecular weight can be obtained. These polycondensates have very good film forming properties so that they can be formed into self-supporting, light-sensitive films.

To our knowledge no high molecular weight light-sensitive polymeric materials were known up to now from which self-supporting films can be formed having good mechanical properties such as high tensile strength, flexibility, transparency and the like. Such self-supporting films of high molecular weight arylazido group-containing polycondensates are for some applications of great importance.

Insolubilization of the high molecular weight, light-sensitive arylazido group-containing polycondensates can be effected to some extent by simply subjecting these polycondensates to a source of actinic light rays. However, in order to obtain the optimum degree of photoinsolubilization and a faster reaction it is preferred to effect the reaction in the presence of catalytic amounts of activating compounds. Among these may be mentioned Michler's ketone and analogs, merocyanine dyes, styryl dye salts, thiazoline compounds, quinolizine compounds, pyrazoline compounds and the like. The concentration of the activating compounds in the coating formula depends somewhat upon the solubility in the particular solvent used, the compatibility of the activating compound with the light-sensitive polymeric material and of course the amount of polymeric material present. A concentration of 2 to 25%, preferably 10% by weight of activating compound based on the weight of the polycondensate will do in most cases. With certain activating compounds an amount less than 2% produces measurable speed increases.

The azido groups are decomposed by actinic light rays giving thereby rise in the polycondensate to free valencies which immediately form cross-linkages between neighbouring polycondensate molecules, rendering the polycondensate insoluble.

The arylazido group-containing polycondensates may be exposed to actinic light from any source and of any type. The light source should preferably, although not necessarily, furnish an effective amount of ultraviolet radiation. Suitable sources of light include carbon arcs, mercury vapor lamps, fluorescent lamps, argon glow lamps, photographic flood lamps and tungsten lamps.

For initiating the photochemical insolubilization of the arylazido group-containing polycondensates a very strong light source is not needed. Indeed, in most of the examples described hereinafter, is used a 80-watt mercury-vapor lamp, placed at a distance of about 15 cm. of the surface to be insolubilized. Brighter light sources are generally not needed since at these relatively low light intensities the photochemically insolubilization of the polycondensates is found to be fast enough.

It has been found that the arylazido group-containing polycondensates according to the invention are photosensitive, in the sense that their exposure to light causes them to be rendered insoluble. Thus, if an arylazido group-containing polycondensate, which is initially soluble, is applied as a coating onto a support and exposed photographically, the exposed areas become insoluble.

The invention is valuable in forming plates and self-supporting films wholly made of the photosensitive polycondensate. The present process also make possible the formation of supported layers on any base by the deposition by any known process of films or coatings of the photosensitive polycondensate. Typical bases are metal sheets (e.g., copper, aluminum, zinc, etc.), glass, cellulose ester film, polyvinyl acetal film, polystyrene film, polyethylene terephthalate film, etc.

The base or support is coated with a solution of the light-sensitive polycondensate in a suitable solvent, whereupon the solvent or solvent mixture is eliminated by known means such as evaporation, leaving a more or less thin coating of the photosenstive polycondensate upon the base or support. Thereafter the dried photosenstive coating is exposed to actinic light rays.

When the support material carrying the photosensitive polycondensate is light-reflecting, there may be present, e.g., superposed on said support and adherent thereto or in the surface thereof, a layer or stratum adsorptive of actinic light, e.g., to minimize reflectance of incident actinic light from the combined support.

The plates formed wholly of or coated with the photosensitive polycondensates are useful in photography, photomechanical reproduction processes, lithography and intaglio printing. More specific examples of such uses are offset printing, silk screen printing, duplicating pads, manifold stencil sheeting coatings, lithographic plates, relief plates, and gravure plates. The term "printing plates" as used in the claims is inclusive of all of these.

A specific application of the invention is illustrated by a typical preparation of a printing plate. In this application, a plate, usually of metal, is formed wholly of, or coated with a film of the photosensitive polycondensate, and the surface of the plate is then exposed to light through a contacted process transparency, e.g., a process positive or negative (consisting solely of opaque and transparent areas and where the opaque areas are of the same optical density, the so-called line or half-tone negative or positive). The light induces the reaction which insolubilizes the areas of the surface beneath the transparent portions of the image, while the areas beneath the opaque portions of the image, remain soluble. The soluble areas of the surface are then removed by a developer, and the insoluble raised portions of the film which remain can serve as a resist image while the exposed base material is etched, forming a relief plate, or the plate can be inked and used as a relief printing plate directly in the customary manner.

The thickness of the photosensitive layer is a direct function of the thickness desired in the relief image and this will depend on the subject being reproduced and particularly on the extent of the non-printing areas. In the case of half-tones the screen used is also a factor. In general, the thickness of the photosensitive layer will vary from about 0.001 mm., to about 7 mm. Layers ranging from about 0.001 to about 0.70 mm. thickness will be used for half-tone plates. Layers ranging from about 0.25 to about 1.50 mm. thickness will be used for the majority of letterpress printing plates, including those wherein half-tone and line images are to be combined.

The solvent liquid used for washing or "developing" the printing plates made from the photosensitive polycondensates must be selected with care, since it should have good solvent power on the unexposed areas, yet have little solvent power on the hardened image or upon the base material, the antihalation layer, or the anchor layer with which the photosensitive composition may be anchored to the support.

The photosensitive polycondensates of the present invention are suitable for other purposes in addition to the printing uses described above.

The surface of a film or layer of a somewhat sticky light-sensitive polycondensate can be treated with a powder after image-wise exposure to light. The exposed areas are hardened and have lost their stickiness. As a consequence the powder is taken up only by the unexposed areas and the powder-image thus formed can be used in transfer processes.

The photosensitive polycondensates of the present invention can also be used in interfacial polycondensation techniques wherein for instance dyes or other compounds are microencapsulated in arylazido group-containing polycondensates which may be insolubilized image-wise by exposure to actinic light rays.

In addition to the applications enumerated above the photosensitive arylazido group-containing polycondensates are suitable for still other purposes: e.g., as ornamental plaques or for producing ornamental effects; as patterns for automatic engraving machines, foundry molds, cutting and stamping dies, rame stamps, relief maps for braille, as rapid cure coatings, e.g., on film base; as variable area and variable density sound tracks on film; for embossing plates, paper, e.g., with a die prepared from the photosensitive compositions; in the preparation of printed circuits, and in the preparation of other plastic articles.

The following examples illustrate the present invention.

EXAMPLE 1

(A) *Preparation of 5-azido-isophthalic acid*

108 g. of 5-amino-isophthalic acid, 182 ml. of hydrochloric acid and 1500 ml. of water are introduced into a three-necked 3-l. flask provided with a stirrer, a refluxer, a thermometer and a dropping funnel. While stirring, the solution is cooled to 0° C., whereafter a solution of 42 g. of sodium nitrite in 180 ml. of water is added dropwise within such a time that the temperature in the reaction mixture can be kept between 0 and 5° C. Thereafter the temperature is kept between 5 and 10° C. while introducing dropwise a solution of 48 g. of sodium azide in 240 ml. of water. After the addition stirring is continued for ½ hour. The 5-azido-isophthalic acid which precipitates is separated from the reaction mixture, sucked off, washed with water and recrystallized from 700 ml. of ethanol. Melting point: 250° C.; yield: 96 g. or ±80%.

(B) *Preparation of 5-azido-isophthaloylchloride*

20 g. of 5-azido isophthalic acid are refluxed until dissolved with 100 ml. of thionyl chloride and thereafter boiled for an hour. The excess of thionyl chloride is evaporated and the residue recrystallized from 100 ml. of hexane. Yield: 19 g. of 5-azido-isophthaloylchloride. Melting point: 52° C.

(C) *Polycondensation*

4.56 g. of 2,2-bis(4-hydroxyphenyl)-propane, 40 ml. of 1 N sodium hydroxide, 10 ml. of methylene chloride and 0.2 g. of triethylbenzylammonium chloride are successively brought into a three-necked 250-cm.³ flask, provided with a stirrer and a dropping funnel. Whilst stirring at 20° C., a solution of 4.88 g. of 5-azido-isophthaloyl chloride in 30 ml. of methylene chloride is added dropwise through the dropping funnel. After the addition of the diacid chloride solution, the reaction mixture is stirred at room temperature for another ½ hour whereby the polycondensate separates as a viscous mass. The supernatant aqueous layer is decanted and the residue diluted with methylene chloride. The polycondensate is isolated by pouring out the diluted residue in methanol, and drying the precipitate in vacuo at 50° C. The intrinsic viscosity was measured in sym.-tetrachloroethane at 25° C. and found to be 1.6 dl./g. A film cast from a methylene chloride solution shows a softening temperature of 85–120° C. and has the following mechanical properties:

| | |
|---|---|
| Modulus of elasticity ____kg./sq. mm__ | 198 |
| Tensile strength ____kg./sq. mm__ | 5.10 |
| Yield strength ____kg./sq. mm__ | 5.35 |
| Elongation ____percent__ | 52.6 |

The polycondensate is composed of structural units of the formula:

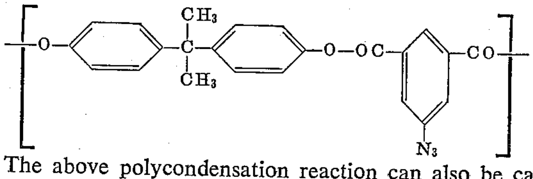

The above polycondensation reaction can also be carried out by replacing the triethylbenzylammonium chloride catalyst by about the same quanity of other catalysts such as triphenylbenzylphosphonium chloride, triphenylmethylphosphonium iodide, 1,2 - ethylene-bis-triphenylphosphonium bromide, p-xylylene - bis - triphenylphosphonium chloride, triphenylmethylarsonium iodide, tetraphenylarsonium chloride and triphenyl-p-nitrobenzylarsonium bromide. These catalysts are much more active than the ammonium catalyst. For obtaining a polyester of the same high molecular weight it is sufficient with these catalysts, after addition of the diacid chloride solution, to continue stirring for 5 to 10 minutes, instead of the ½ hour mentioned above.

(D) *Photo-insolubilization*

A solution is prepared of the following composition:

0.05 g. of the above prepared arylazido polycondensate
0.005 g. of Michler's ketone
4 ml. of methylene chloride
1 ml. of sym.-tetrachlorethane.

Onto an aluminum foil a layer of 0.025 mm. thickness is coated from said solution so that after drying a light-sensitive layer of less than 1$\mu$ thickness is obtained. The exposure takes place through a process transparency and development occurs by means of a mixture of methylene chloride sym.-tetrachlorethane (50:50) by which the unexposed areas are dissolved. To render the image formed easily visible the layer is dried and colored by means of a solution of Crystal Violet Carbinol (C.I. 42,555) in the same mixture of methylene chloride and sym.-tetrachloroethane. The superfluous dyestuff is rinsed off by means of water and the layer is dried once again.

It has been found that a very good image is obtained by a 15 second exposure with an 80-watt mercury vapor lamp placed at a distance of 15 cm. When exposing by means of an ordinary 300-watt lamp an exposure-time of 2 minutes is required.

When omitting the Michler's ketone from the solution from which the light-sensitive layer is coated, an exposure of 2½ minutes in the case of an 80-watt mercury vapor lamp is needed.

EXAMPLE 2

(A) *Preparation of 5-azido-terephthalic acid*

(1) *5-azido-dimethylterephthalate.*—41 g. of amino-dimethylterephthalate, 160 ml. of hydrochloric acid and 120 ml. of water are brought into a three-necked 2 l. flask provided with a stirrer, a refluxer, a thermometer and a dropping funnel. While stirring, the solution is cooled to 0° C., whereafter a solution of 14 g. of sodium nitrite in 60 ml. of water is added dropwise within such a time that the temperature in the reaction mixture can be kept between 0 and 5° C. Thereafter the temperature is kept between 5 and 10° C. while introducing dropwise a solution of 16 g. of sodium azide in 80 ml. of water. After the addition stirring is continued for ½ hour. The precipitate is filtered, washed with water and dried in vacuo. Melting point: 70° C.; yield: 42 g. or ±90%.

(2) *5-azido-terephthalic acid.*—42 g. of azidodimethylterephthalate are dissolved in 170 ml. of hot methanol in a 1 l. flask provided with a condenser. A solution of 15 g. of sodium hydroxide in 150 ml. of water is added and the reaction mixture is refluxed for ½ hour.

After cooling, the solution is acidified with 6 N hydrochloric acid. The precipitate is filtered, washed with water and dried at 50° C. in vacuo. Yield: 34 g. or ±90%; decomposition point: ±220° C.

(B) *Preparation of 5-azido-terephthaloyl chloride*

10 g. of azido-terephthalic acid are refluxed for 2 hours with 50 ml. of thionyl chloride. The solution is evaporated and the residue recyrstallized from 30 ml. of hexane. Yield: 8 g.; melting point: 50° C.

(C) *Polycondensation*

The polycondensation of 5-azido-terephthaloyl chloride with 2,2-bis(4-hydroxyphenyl)-propane is carried out in an analogous way as described for the polycondensation of 5-azido-isophthaloyl chloride and 2,2-bis(4-hydroxyphenyl)-propane in Example 1(C).

(D) *Photoinsolubilization*

The process of Example 1(D) is repeated using the above obtained 5-azido-terephthaloyl polyester instead of the 5-azido-isophthaloyl polyester.

In this case a good image is only obtained after an exposure time of 10 minutes when using an 80-watt mercury vapor lamp placed at a distance of 15 cm.

EXAMPLES 3–10

The polycondensation of 5-azido-isophthaloyl chloride with 2,2-bis(4-hydroxyphenyl)-propane as described in Example 1 is repeated with the inclusion of other dihydric compounds or of additional dicarboxylic acids, or by replacing the 2,2-bis(4-hydroxyphenyl)-propane by another bisphenol. The light-sensitive polycondensates obtained are applied to a support as described in Example 1(D) exposed to light through a process transparency and developed. The results are given in the following table.

| Example | Quantity of 5-azido-isophthaloyl chloride in g. | Additional dicarboxylic acid chloride | | Bisphenol | |
|---|---|---|---|---|---|
| | | Name | Quantity used in g. | Name | Quantity used in g. |
| 3 | 4.88 | | | Bisphenol A [1] | 2.28 |
| 4 | 2.44 | Isophthaloyl chloride | 2.03 | do | 4.56 |
| 5 | 2.44 | do | 6.09 | do | 9.12 |
| 6 | 3.904 | Diallylester of pyrometallitic acid chloride. | 1.484 | do | 4.56 |
| 7 | 4.88 | | | do | 4.104 |
| 8 | 2.44 | | | Isomeric mixture [2] | 2.0 |
| 9 | 2.44 | | | 3,3-bis(4-hydroxyphenyl)-pentane | 2.56 |
| 10 | 2.44 | | | 2,2-bis(4-hydroxyphenyl)-butane | 2.42 |

[1] By Bisphenol A is meant: 2,2-bis(4-hydroxyphenyl)-propane.

[2] By isomeric mixture is meant: the isomeric mixture of 4,4′-di(hydroxyphenyl)-methane, 2,4′-di(hydroxyphenyl)-mathane and 2,2′-di(hydroxyphenyl)-methane obtained when reacting formaldehyde with an excess of phenol in the presence of an acidic catalyst, as described in copending application Serial No. 169,116, filed January 26, 1962.

| Example | Additional dihydroxy compound | | Intrinsic viscosity, dl./g. | Time needed to obtain a good image after illumination at 15 cm. with— | | |
|---|---|---|---|---|---|---|
| | Name | Quantity used in g. | | 80 Watt mercury vapor lamp | Ordinary 300 Watt lamp | 80 Watt mercury vapor lamp but without addition of Michler's ketone |
| 3 | 5-pentadecyl resorcine | 3.2 | 1.2 | 10 sec | 30 sec | |
| 4 | | | 1.6 | 10 sec | 2½ min | |
| 5 | | | 0.7 | 2 min | | |
| 6 | | | 0.4 | 20 sec | 5 min | 1½ min. |
| 7 | 4,4′-dihydroxy chalcone | 0.480 | 0.4 | 5 sec | 2 min | 30 sec. |
| 8 | | | 0.54 | 20 sec | 5 min | 2 min. |
| 9 | | | 1.0 | 10 sec | 5 min | 2 min. |
| 10 | | | 0.9 | 10 sec | 2½ min | 1½ min. |

EXAMPLE 11

2.28 g. of 2,2-bis(4-hydroxyphenyl)-propane, 20 ml. of 1 N sodium hydroxide, 5 ml. of methylene chloride and 0.1 g. of triethylbenzyl ammonium chloride are successively brought into a three-necked 250-cm.$^3$ flask, provided with a stirrer and a dropping funnel. Whilst stirring at 20° C., a solution of 3.505 g. of 4-chloro-6-azido benzene 1,3-disulfochloride in 15 ml. of methylene chloride is added dropwise through the dropping funnel. The 4-chloro-6-azido-benzene-1,3-disulfochloride with melting point 138° C. is prepared in the same way as the 5-azido isophthaloyl chloride in Example 1 by starting from the sodium salt of 4-chloro-6-amino-benzene-disulfonic acid. After the addition of the diacid chloride solution, the reaction mixture is stirred at room temperature for another ½ hour whereby the polycondensate separates as a viscous mass. The supernatant aqueous layer is decanted and the residue diluted with methylene chloride. The polycondensate is isolated by pouring out the diluted residue in methanol, and drying the precipitate at 50° C. The intrinsic viscosity was measured in sym.-tetrachloroethane at 25° C. and found to be 0.7 dl./g.

The polycondensate has the formula:

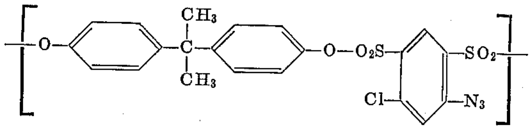

The polycondensate is worked up into a light-sensitive layer, exposed to light and developed as described in Example 1.

Exposure time needed to give a good image:
- With 80-watt mercury vapor lamp ______sec__ 10
- With ordinary 300-watt lamp __________min__ 5

EXAMPLE 12

(A) *Preparation of 4,4′ - diazidostilbene - 2,2′ - disulfonic acid disodium salt*

37 g. of 4,4′-diaminostilbene-2,2′-disulfonic acid, 8 g. of sodium hydroxide and 200 ml. of water are brought into a three-necked 1 l. flask, provided with a stirrer, a refluxer, a thermometer and a dropping funnel. While stirring, a solution of 14 g. of sodium nitrite in 40 ml. of water is added. The solution is now cooled to 0° C. and 80 ml. of 6 N hydrochloric acid are added dropwise so that the reaction temperature can be kept between 0° and 5° C. Thereafter a solution of 14 g. of sodium azide in 40 ml. of water is added dropwise at a temperature between 5° and 15° C. Stirring is continued for ½ hour. The precipitate is filtered off, washed with alcohol and dried. Yield: 13 g.

(B) *4,4′-diazidostilbene-2,2′-disulfochloride*

13 g. of the above obtained disodium salt and 100 ml. of thionyl chloride are refluxed in a 250 ml. flask for 8 hours. The excess of thionyl chloride is evaporated and the residue extracted with 100 ml. of trichloroethane. After filtering the mixture, the solution is evaporated and the residue is filtered and washed with ether. Yield: 2.5 g.; decomposition point: ±220° C.

(C) *Polycondensation*

4.56 g. of 2,2-bis(4-hydroxyphenyl)-propane, 40 ml. of 1 N sodium hydroxide, 10 ml. of methylene chloride and 0.2 g. of triethylbenzylammonium chloride are successively brought into a three-necked 250-cm.$^3$ flask, provided with a stirrer and a dropping funnel. Whilst stirring at 20° C., a solution of 2.03 g. of isophthaloyl chloride and 4.5 g. of 4,4′ - diazidostilbene-2,2′-disulfochloride in 30 ml. of methylene chloride is added dropwise through the dropping funnel. After the addition of the diacid chloride solution, the reaction mixture is stirred at room temperature for another ½ hour whereby the polycondensate separates as a viscous mass. The supernatant aqueous layer is decanted and the residue diluted with methylene chloride. The polycondensate is isolated by pouring out the diluted residue into methanol, and drying the precipitate in vacuo at 50° C. The intrinsic viscosity was measured in sym.-tetrachloroethane at 25° C. and found to be 0.20 dl./g.

The polycondensate is composed of structural units of the formula:

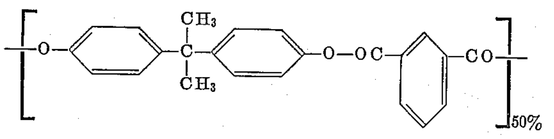

and

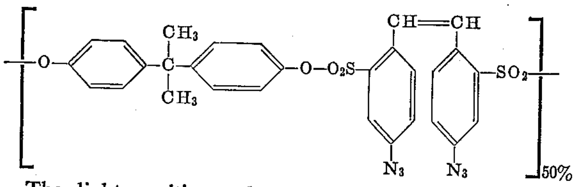

The light-sensitive polycondensate is worked up into a layer, exposed to light and developed as described in Example 1.

Exposure time needed to give a good image:
- With 80-watt mercury vapor lamp _______sec__ 30
- With ordinary 300-watt lamp __________min__ 5

EXAMPLE 13

The polycondensation reaction described in Example 12(C) is repeated, but the mixture of isophthaloyl chloride and of 4,4′-diazidostilbene-2,2′-disulfochloride is replaced by 8.66 g. of 4,4′-diazidodiphenyl-2,2′-disulfochloride. This compound is obtained by analogous reactions as described in Examples 12(A) and 12(B), starting from 4,4′-diaminodiphenyl-2,2′-disulfonic acid.

The polycondensate obtained is composed of structural units of the formula:

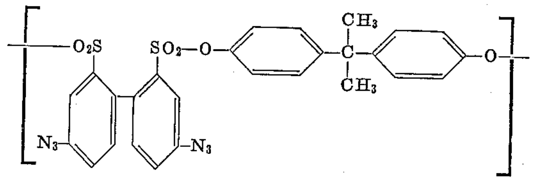

This light-sensitive polycondensate is worked up into a layer, exposed to light and developed as described in Example 1.

With an 80-watt mercury vapor lamp an exposure time of 1 min. is sufficient to give a good image.

EXAMPLE 14

The polycondensation reaction described in Example 12(C) is repeated, but in the mixture of isophthaloyl chloride and of 4,4′ - diazidostilbene-2,2′-disulfochloride the latter is replaced by 3.66 g. of 2-azidonaphthalene-6,8-disulfochloride. This compound is obtained by analogous reactions as those described in Examples 12(A) and 12(B) starting from 2-aminonaphthalene-6,8-disulfonic acid.

The polycondensate obtained is composed of structural units of the formula:

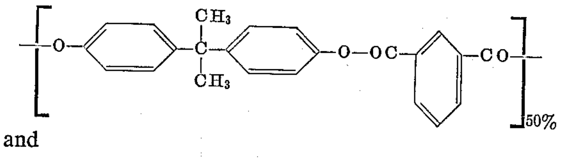

and

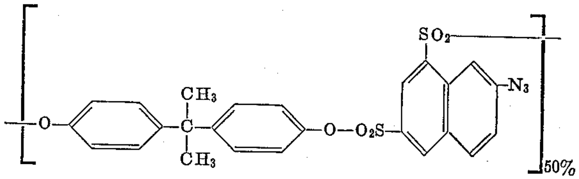

This light-sensitive polycondensate is worked up into a layer, exposed to light and developed as described in Example 1.

With an 80-watt mercury vapor lamp an exposure time of 20 sec. is sufficient to give a good image.

When omitting the Michler's ketone in the solution from which the light-sensitive layer is coated, an exposure time of 20 sec. also is sufficient to give a good image.

EXAMPLE 15

(A) *Preparation of 5-(4-azidobenzoyloxy)-isophthalic acid*

7.28 g. of 5-hydroxy-isophthalic acid, 5 g. of sodium hydroxide and 100 ml. of water are brought into a 500 ml. three-necked flask provided with a stirrer, a thermometer and a dropping funnel. While stirring, the solution is cooled to 5° C. and a solution of 7.26 g. of p-azidobenzoyl chloride in 50 ml. of aceton is added dropwise so that the temperature can be kept at ±5° C. The reaction mixture is filtered and the filtrate is acidified with a solution of 10 ml. of 12 N hydrochloric acid and 30 ml. of water.

The precipitate is filtered and directly recrystallized from a solution of 150 ml. of methanol and 150 ml. of aceton. Yield: 9 g.; decomposition point: 230° C.; melting point: 240° C.

(B) *5-(4-azidobenzoyloxy)-isophthaloyl chloride*

5 g. of the above acid and 25 ml. of thionyl chloride are refluxed for 2 hours in a 100 ml. flask. The excess of thionyl chloride is evaporated and the residue recrystallized from 50 ml. of hexane and 50 ml. of benzene. Yield: 4 g.; melting point: 139° C.

(C) *Polycondensation*

The polycondensation reaction described in Example 1(C) is repeated with 2.28 g. of 2,2 - bis(4 - hydroxyphenyl)-propane and 3.64 g. of the above prepared 5-(4-azidobenzoyloxy)-isophthaloyl chloride. The light-sensitive polycondensate obtained has an intrinsic viscosity in sym.-tetrachloroethane at 25° C. of 0.57 dl./g. and is composed of recurring units of the formula:

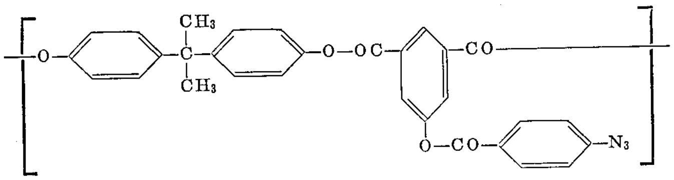

Thereafter the polycondensate is worked up into a layer, exposed to light and developed as described in Example 1(D).

Exposure time needed to give a good image:
- With 80-watt mercury vapor lamp ________sec__ 45
- With ordinary 300-watt lamp ____________min__ 3

EXAMPLE 16

5-(4 - azidobenzenesulfonyloxy)-isophthaloyl chloride is prepared in the same way as the 5-(4-azidobenzoyloxy)-isophthaloyl chloride of Example 15. This diacid chloride has a melting point of 50° C. The polycondensation reaction described in Example 1(C) is repeated with 2.28 g. of 2,2-bis(4-hydroxyphenyl)-propane and 4 g. of 5-(4-azidobenzenesulphonyloxy) - isophthaloyl chloride. Intrinsic viscosity in sym.-tetrachloroethane at 25° C.: 0.4 dl./g. The polycondensate is composed of recurring units of the formula:

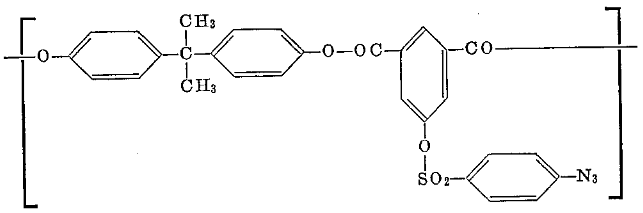

This light-sensitive polycondensate is worked up into a layer, exposed to light and developed as described in Example 1(D).

Exposure time needed to give a good image: With 80-watt mercury vapor lamp—2 minutes.

EXAMPLE 17

1.14 g. of 2,5-dimethyl piperazine, 20 ml. of 1 N sodium hydroxide, 0.1 g. of triethylbenzyl ammonium chloride and 5 ml. of methylene chloride are successively brought into a three-necked 250-cm.$^3$ flask, provided with a stirrer and a dropping funnel. Whilst stirring at 20° C., a solution of 2.44 g. of 5-azido-isophthaloyl chloride in 15 ml. of methylene chloride is added dropwise through the dropping funnel. After the addition of the diacid chloride solution, the reaction mixture is stirred at room temperature for another ½ hour whereby the polycondensate separates as a viscous mass. The supernatant aqueous layer is decanted and the residue is diluted with methylene chloride. The polycondensate is isolated by pouring out the polymer solution into methanol, and drying the precipitate in vacuo at 50° C. The intrinsic viscosity was measured in sym.-tetrachloroethane at 25° C. and found to be 0.45 dl./g.

The polycondensate has the formula:

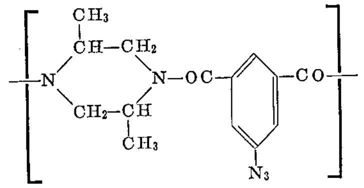

The light-sensitive polycondensate is worked up into a layer, exposed to light and developed as described in Example 1.

Exposure time needed to give a good image: With 80-watt mercury vapor lamp—2½ min.

EXAMPLES 18 to 33

For evaluating the influence of different activating compounds upon the photo insolubilization of the arylazido group-containing polycondensates, a series of experiments was carried out following the procedure of Example 1, but using instead of the Michler's ketone other activating compounds. As in Example 1 there is added 0.005 g. of activating compound, i.e., 10% by weight relative to the arylazido polycondensate present. The results of these experiments are given in the following table.

| Example | Activating compound | Time needed to obtain a good image after illumination at 15 cm. with— 80 Watt mercury vapor lamp | Ordinary 300 Watt lamp |
|---|---|---|---|
| 18 | p-Dimethylaminobenzophenone | 10 sec. | 4 min. |
| 19 | p-Dimethylaminobenzaldehyde | 15 sec. | 4 min. |
| 20 | p-Dimethylaminoacetophenone | 20 sec. | 8 min. |
| 21 | α,α-bis(p-dimethylaminophenyl)-methanol | 15 sec. | 6 min. |
| 22 | 1,1-bis(p-dimethylaminophenyl)-ethylene | 40 sec. | 6 min. |
| 23 | 1-methyl-2-benzoylmethylene-naphthol(1,2)-thiazoline | 20 sec. | 3 min. |
| 24 | Quinolizine-4-one | 20 sec. | 4 min. |
| 25 | 1,3-diphenyl-5-p-hydroxyphenyl-$\Delta^2$-pyrazoline | 10 sec. | 2 min. |
| 26 | 1,3-diphenyl-5-p-iodophenyl-$\Delta^2$-pyrazoline | 1 min. | 15 min. |
| 27 | 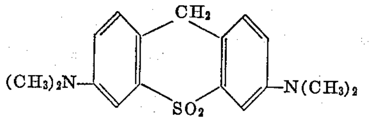 | 15 sec. | 8 min. |
| 28 | 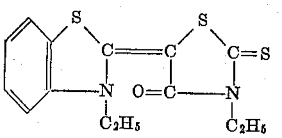 | 1 min. | 4 min. |
| 29 | 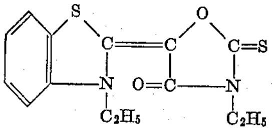 | 20 sec. | 4 min. |
| 30 | 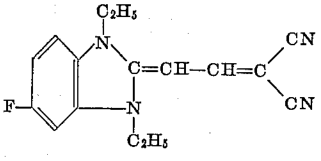 | 40 sec. | 3 min. |
| 31 | 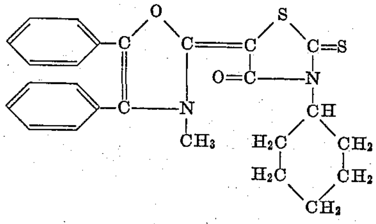 | 20 sec. | 2 min. |
| 32 | 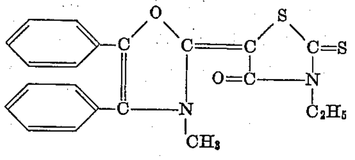 | 15 sec. | 2 min. |
| 33 | 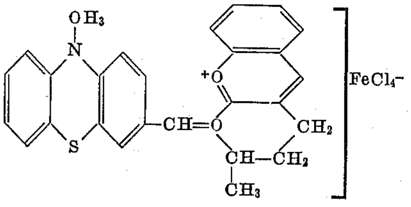 | 1 min. | |

What we claim is:

1. A photographic reproduction process, which comprises exposing to a process transparency a supported layer of a soluble, high molecular weight, light-sensitive arylazido group-containing polyester obtained by the interfacial polycondensation of at least one monomer which is a dihydroxyl compound and at least one monomer which is an acid compound, said acid compound comprising an arylazido substituent, until the exposed regions of the layer become insoluble, dissolving only the polyester in the unexposed regions of the layer, and leaving an image of insoluble polyester remaining on the support.

2. A photographic reproduction process, which comprises exposing to a process transparency a self-supporting film of a soluble, high molecular weight, light-sensitive arylazido group-containing polyester obtained by the interfacial polycondensation of at least one monomer which is a dihydroxyl compound and at least one monomer which is an acid compound, said acid compound comprising an arylazido substituent, until the exposed regions of the self-supporting film become insoluble, dissolving only the polyester in the unexposed regions of the self-supporting film, and leaving an image of insoluble polyester in the form of a self-supporting film.

3. A photographic reproduction process which comprises exposing to a process transparency a supported layer of a soluble, high molecular weight, light-sensitive arylazido group containing polycondensate obtained by the interfacial polycondensation of a secondary amine and a monomeric intermediate containing therefore an arylazido substituent, said intermediate being selected from the group consisting of dicarboxylic acid halides, phosgene, glycol-bischloroformates, disulfonic acid halides and mixtures thereof, until the exposed regions of the layer become insoluble, dissolving only the polycondensate in the unexposed regions of the layer, and leaving an image of insoluble polycondensate remaining on the support.

4. Soluble, high molecular weight, light-sensitive arylazido group-containing polyesters, characterized thereby that they are obtained by interfacial polycondensation reaction of at least one monomer which is a dihydroxyl compound and at least one monomer which is an acid compound, said acid compound comprising an arylazido substituent.

5. Soluble, high molecular weight, light-sensitive arylazido group containing polyesters, according to claim 1, characterized thereby, that they are obtained by an interfacial polycondensation reatcion in which one of the immiscible solvents present is also a solvent for the arylazido group-containing polyester to be formed.

6. Soluble, high molecular weight, light-sensitive arylazido group-containing polyesters according to claim 1, characterized thereby that the interfacial polycondensation reaction is carried out in the presence of minor amounts of onium catalysts taken from the group consisting of quaternary ammonium compounds, tertiary sulfonium compounds, quaternary fosfonium compounds and quaternary arsonium compounds.

7. Soluble, high molecular weight, light-sensitive arylazido group-containing polyesters according to claim 1, characterized thereby, that one of the monomeric intermediates is an alkali metal salt of a dihydric phenol and the other monomeric intermediates are taken from the group consisting of dicarboxylic acid halides, disulfonic acid halides and mixtures thereof.

8. Soluble, high molecular weight, light-sensitive arylazido, group-containing polycondensates characterized thereby, that one of the monomeric intermediates is a secondary amine, and the other monomeric intermediates which comprise an arylazido substitutent are taken from the group consisting of dicarboxylic acid halides, phosgene, glycol-bischloroformates, disulfonic acid halides and mixtures thereof.

9. The soluble, high molecular weight, light-sensitive arylazido group containing polycondensates according to claim 5 wherein the other monomeric intermediate is a dicarboxylic acid halide.

10. Soluble, high molecular weight, light-sensitive polyesters derived from 2,2-bis(4-hydroxyphenyl)-propane and 5-azido-isophthalic acid.

11. Soluble, high molecular weight, light-sensitive polyesters derived from 5-azido-isophthalic acid and a mixture of 2,2-bis(4-hydroxyphenyl)-propane and 4,4′-dihydroxychalcone.

12. Soluble, high molecular weight, light-sensitive polyesters derived from 2,2-bis(4-hydroxyphenyl)-propane and a mixture of 4,4′-diazidostilbene-2,2-disulfonic acid and of isophthalic acid.

13. Soluble, high molecular weight, light-sensitive polyamides derived from 2,5-dimethylpiperazine and 5-azido-isophthalic acid.

14. Light-sensitive self-supporting films comprising a soluble, high molecular weight, light-sensitive arylazido group-containing polyester according to claim 1.

15. Process for the photoinsolubilization of polyesters which comprises, exposing to actinic light rays a photosensitive composition comprising a soluble, high molecular weight, light-sensitive arylazido group-containing polyester obtained by the interfacial polycondensation reaction of at least one monomer which is a dihydroxyl compound and at least one monomer which is an acid compound, said acid compound comprising an arylazido substituent, whereby the azido group is decomposed and the polyester is cross-linked.

References Cited

UNITED STATES PATENTS

| | | | |
|---|---|---|---|
| 2,708,617 | 5/1955 | Magat et al. | 260—47 |
| 2,949,440 | 8/1960 | Katz | 260—78 |
| 3,002,003 | 9/1961 | Merrill et al. | 96—115 |
| 3,193,530 | 7/1965 | Oxenrider | 260—47 X |
| 3,215,667 | 11/1965 | Caldwell | 260—47 X |
| 3,230,195 | 1/1966 | Conix | 260—47 |
| 3,236,808 | 2/1966 | Goldberg et al. | 260—47 |

OTHER REFERENCES

Morgan, P. W.: "Interfacial Condensation," S.P.E. Journal, vol. 15, pp. 485–496.

NORMAN G. TORCHIN, *Primary Examiner.*

C. L. BOWERS, *Assistant Examiner.*

UNITED STATES PATENT OFFICE
CERTIFICATE OF CORRECTION

Patent No. 3,345,171 October 3, 1967

Urbian Leopold Laridon et al.

It is hereby certified that error appears in the above numbered patent requiring correction and that the said Letters Patent should read as corrected below.

Column 2, line 15, for "intermediate" read -- intermediates --; column 3, line 3, for "inerfacial" read -- interfacial --; column 4, line 10, for "polycondensate" read -- polycondensates --; lines 50 and 51, for "photosenstive", each occurrence, read -- photosensitive --; column 6, line 47, for "quanity" read -- quantity --; line 72, for "tetrachlorethane" read -- tetrachloroethane --; column 13, in the table, second column, opposite Example 33, for "$OH_3$" read -- $CH_3$ --; column 15, line 29, for "reatcion" read -- reaction --; lines 27, 33 and 41, for the claim reference numeral "1", each occurrence, read -- 4 --; line 47, after "azido" strike out the comma; column 16, line 6, for the claim reference numeral "5" read -- 8 --; line 24, for the claim reference numeral "1" read -- 4 --.

Signed and sealed this 10th day of June 1969.

(SEAL)
Attest:

EDWARD M. FLETCHER, JR.
Attesting Officer

WILLIAM E. SCHUYLER, JR.
Commissioner of Patents